(12) United States Patent
Do

(10) Patent No.: US 12,720,916 B2
(45) Date of Patent: Aug. 25, 2026

(54) ULTRA-THIN FIN LED DEVICE AND ULTRA-THIN FIN LED ELECTRODE ASSEMBLY

(71) Applicant: Kookmin University Industry Academy Cooperation Foundation, Seoul (KR)

(72) Inventor: Young Rag Do, Seoul (KR)

(73) Assignee: Kookmin University Industry Academic Cooperation Foundation, Seoul (KR)

( * ) Notice: Subject to any disclaimer, the term of this patent is extended or adjusted under 35 U.S.C. 154(b) by 750 days.

(21) Appl. No.: 17/974,463

(22) Filed: Oct. 26, 2022

(65) Prior Publication Data

US 2023/0126339 A1 Apr. 27, 2023

(30) Foreign Application Priority Data

Oct. 26, 2021 (KR) ........................ 10-2021-0143367

(51) Int. Cl.

| | |
|---|---|
| ***H10H 20/821*** | (2025.01) |
| ***H10H 20/01*** | (2025.01) |
| ***H10H 20/825*** | (2025.01) |
| ***H10H 20/831*** | (2025.01) |
| ***H10H 20/84*** | (2025.01) |
| ***H10H 29/14*** | (2025.01) |

(52) U.S. Cl.

CPC ...... *H10H 20/821* (2025.01); *H10H 20/0137* (2025.01); *H10H 20/018* (2025.01); *H10H 20/825* (2025.01); *H10H 20/831* (2025.01); *H10H 20/84* (2025.01); *H10H 29/142* (2025.01); *H10H 20/032* (2025.01); *H10H 20/034* (2025.01)

(58) Field of Classification Search

CPC ............. H10H 20/821; H10H 20/0137; H10H 20/018; H10H 20/825; H10H 20/831; H10H 20/84; H10H 29/142; H10H 20/032; H10H 20/034; H10H 20/8314; H10H 20/819; H10H 20/8316; H01L 25/0753

See application file for complete search history.

(56) References Cited

U.S. PATENT DOCUMENTS

| | | | | |
|---|---|---|---|---|
| 11,677,056 | B2 * | 6/2023 | Takeya | H10H 20/857 257/89 |
| 2022/0130895 | A1 * | 4/2022 | Kim | H10W 90/00 |
| 2022/0336719 | A1 * | 10/2022 | Inazu | H10H 20/856 |
| 2022/0344537 | A1 * | 10/2022 | Xie | G09G 3/32 |
| 2024/0178346 | A1 * | 5/2024 | Chen | H10H 20/816 |

FOREIGN PATENT DOCUMENTS

| | | |
|---|---|---|
| KR | 97070023 | 1/1997 |
| KR | 101436123 | 11/2014 |
| KR | 101490758 | 2/2015 |
| KR | 102053217 | 1/2020 |

* cited by examiner

*Primary Examiner* — Eliseo Ramos Feliciano
*Assistant Examiner* — Thaddeus J. Kolb
(74) *Attorney, Agent, or Firm* — AdamsIP, LLC

(57) ABSTRACT

The present invention relates to an LED device, more particularly, to an ultra-thin fin LED device and a method for manufacturing the same.

13 Claims, 10 Drawing Sheets

ULTRA-THIN FIN LED DEVICE AND ULTRA-THIN FIN LED ELECTRODE ASSEMBLY

CROSS REFERENCE TO RELATED APPLICATION

The present application claims priority to Korean Patent Application No. 10-2021-0143367, filed Oct. 26, 2021, the entire contents of which is incorporated herein for all purposes by this reference.

BACKGROUND OF THE INVENTION

Field of the Invention

The present invention relates to an LED device, and more particularly, to an ultra-thin fin LED device and an ultra-thin fin LED electrode assembly including the same.

Description of the Related Art

Micro-LEDs and nano-LEDs may implement an excellent feeling of color and high efficiency and may be eco-friendly materials, thereby being used as core materials for displays. In line with such market conditions, recently, research for developing new nanorod LED structures or shell-coated nano-cable LEDs through new manufacturing processes is being carried. In addition, research on a protective film material is being carried out to achieve high efficiency and high stability of a protective film covering an outer surface of nanorods, and research and development of a ligand material advantageous for a subsequent process are also being carried out.

Recently, large-sized red, green, and blue micro-LED display TVs have been commercialized in line with research in such material fields, and in the future, TVs, which implement full-color through blue subpixels implemented using blue micro-LEDs or nano-LEDs and red and green subpixels implemented using quantum dots emission through the blue LEDs, will be commercialized. In addition, red, green, and blue nano-LED display TVs will also be commercialized.

Micro-LED displays have advantages such as high performance characteristics, very long theoretical lifetime, and very high efficiency, but when micro-LED displays are developed as displays with 8K resolution, a red micro-LED, a green micro-LEI), and a blue micro-LED should be put in one-to-one correspondence with each of nearly 100 million subpixels. Thus, through pick and place technology for manufacturing micro-LED displays, it is difficult to manufacture true high-resolution commercial displays ranging from smartphones to TVs due to the limitations of process technology, considering a high unit price, a high process defect rate, and low productivity. In addition, it is more difficult to individually arrange nano-LEDs on subpixels using pick and place technology for micro-LEDs.

In order to overcome such difficulty, Korean Patent Registration No. 10-1436123 discloses a display manufactured through a method of dropping a solution mixed with nanorod-type LEDs on subpixels and then forming an electric field between two alignment electrodes to self-align nanorod-type LIED devices on the electrodes and form the subpixels.

However, in the used nanorod-type LED devices, since a major axis of the LED device coincides with a stack direction of the layers constituting the device, that is, a stack direction of each layer in a p-GaN/InGaN multi-quantum well (MQW)/n-GaN stacked structure, an emission area is narrow. In addition, when manufacturing a nanorod-type LED device by etching a commercially available wafer, it is necessary to etch the wafer as much as the length of the major axis, so surface defects are highly likely to occur due to a lot of etchings. Also, since the emission area is narrow, surface defects have a relatively large effect on the degradation in efficiency. Also, it is difficult to optimize the electron-hole recombination rate, so there is a problem that the luminous efficiency is significantly lower than that of an original wafer. Accordingly, there is a problem in that a large number of LEDs must be mounted in order for an apparatus to which such a nanorod-type LED device is mounted to express a desired level of luminous efficiency.

Meanwhile, in order to increase the emission area of the rod-type LED device, a structural change may be considered so that the major axis of the rod-type LED device is perpendicular to the stacking direction of each layer. In this case, the major axis should be the length and/or width of the LED device. Since the thickness of the device becomes thinner compared to the length or width, the possibility of surface defects is low due to the shallow etching depth when the wafer is etched, but after etching, the area of the lower surface of the etched LED pillar connected to the wafer is large, so it is not easy to separate the etched LED pillar. In addition, it may be difficult to obtain an LED device having a desired size and efficiency because the separated LED device may not be completely separated during separation. In addition, in the case of a rod-type LED device in which the stacking directions of the n-type semiconductor layer and p-type semiconductor layer are perpendicular to the major axis of the device, when mounted on an electrode through self-alignment by applying an electric field, the LED device must be self-aligned so that the surface of the p-type semiconductor layer or n-type semiconductor layer is placed on the electrode. When the side surface of the device is self-aligned so as to be in contact with the electrode, an electric short occurs when driving power is applied, and there is a problem in that light is not emitted.

Therefore, there is an urgent need to develop a new LED material that can be easily self-aligned using an electric field and mounted on the electrode, and can be mounted in a state where it can emit light regardless of the aligned surface during self-alignment. and has a wide emission area, minimizes or prevents a degradation in efficiency due to surface defects, and has an optimized electron-hole recombination rate.

SUMMARY OF THE INVENTION

The present invention is devised to solve the above-described problems, and an object of the present invention is to provide an ultra-thin fin LED device which reduces the thickness of a photoactive layer exposed to a surface to prevent a degradation in efficiency due to surface defect while increasing an emission area, maintains high efficiency in light extraction efficiency by minimizing a degradation in electron-hole recombination efficiency due to non-uniformity of electron and hole velocities and the resulting degradation in luminous efficiency, and has improved luminance, and an ultra-thin fin LED electrode assembly including the same.

In addition, another object of the present invention is to provide an ultra-thin fin LED device which is very suitable for a method of self-aligning a device on an electrode by an electric field, and can be driven regardless of an alignment surface that can drive the device without electric short regardless of the arrangement surface of the device in contact with the electrode through self-alignment, and an ultra-thin fin LED electrode assembly including the same.

On the other hand, it is informed that the present invention has been researched with the support of the following national R&D projects.

[Project Series Number] 1415174040
[Project Number]20016290
[Government Department Name] Ministry of Trade, Industry and Energy [Project Management (Specialized) Authority Name] Korea Institute of Industrial Technology Evaluation and Planning
[Research Program Name] Electronic component industry technology development—Super large micro LED modular display
[Research Project Name] Development of sub-micron blue light source technology for modular display
[Contribution Rate] ⅓
[Project Execution Organization Name] Kookmin University Industry Academic Cooperation
[Research Period] 2021.04.01 to 2024.12.31
[Project Series Number] 1711105790
[Project Number] 2016R1A5A1012966
[Government Department Name] Ministry of Science and Technology Information and Communication
[Project Management (Specialized) Authority Name] National Research Foundation of Korea
[Research Program Name] Science and Engineering (S/ERC)
[Research Project Name] Circadian ICT Research Center Using Hybrid Devices
[Contribution Rate] ⅓
[Project Execution Organization Name] Kookmin University Industry-Academic Cooperation Foundation
[Research Period] 2021.01.01 to 2021.12.31
[Project Series Number] 1711130702
[Project Number] 2021R1A2C2009521
[Government Department Name] The Ministry of Science and ICT
[Project Management Administration Authority Name] National Research Foundation of Korea
[Research Program Name] Middle Career Researcher Support Project
[Research Project Name] Development of Dot-LED Material and Display Source/Application Technology
[Contribution Ratio] ⅓
[Name of Project Execution Organization] Kookmin University Industry Academy Cooperation Foundation
[Period of Research] Mar. 1, 2021 to Feb. 28, 2022

In order to achieve the above objects, the present invention provides a ultra-thin fin LED device, including a device unit that has a length, a width and a thickness in mutually perpendicular x, y, and z-axis directions, respectively, the length being longer than the width and the thickness, and includes a first conductive semiconductor layer, a photoactive layer, and a second conductive semiconductor layer that are sequentially stacked in the z-axis direction, and an electrode unit that includes a first handle electrode formed to at least partially cover one end surface of the device unit in the x-axis direction and a second handle electrode formed to at least partially cover the other end surface opposite to the one end surface, wherein the first handle electrode is electrically connected only to the first conductive semiconductor layer among the first conductive semiconductor layer, the photoactive layer, and the second conductive semiconductor layer, and the second handle electrode is electrically connected only to the second conductive semiconductor layer among the first conductive semiconductor layer, the photoactive layer, and the second conductive semiconductor layer.

According to an embodiment, the ultra-thin fin LED device may further include an insulating unit, wherein the insulating unit including a first insulating film that is interposed between the first handle electrode and a portion corresponding to the photoactive layer and the second conductive semiconductor layer on one end surface of the device unit in the x-axis direction so that the first handle electrode is electrically connected only to the first conductive semiconductor layer, and a second insulating film that is interposed between the second handle electrode and a portion corresponding to the photoactive layer and the first conductive semiconductor layer on the other end surface of the device unit in the x-axis direction so that the second handle electrode is electrically connected only to the second conductive semiconductor layer.

In addition, the ultra-thin fin LED device may further include any one of the first electrode layer provided to cover a lower surface of the first conductive semiconductor layer and a second electrode layer provided to cover an upper surface of the second conductive semiconductor layer, wherein the first electrode layer may be indirectly electrically connected to the first handle electrode via the first conductive semiconductor layer or directly electrically connected to the first handle electrode, the second electrode layer may be indirectly electrically connected to the second handle electrode via the second conductive semiconductor layer or directly electrically connected to the second handle electrode.

In addition, the device unit may include a step formed by protruding any layer constituting the device unit in order to increase a contact area between any one or both end surfaces of both ends of the device unit in the x-axis direction and any one or two of the handle electrodes.

In addition, the first handle electrode and the second handle electrode may be provided to completely cover an end surface of the device unit in the x-axis direction in order to reduce a contact resistance with an electrode on which the ultra-thin fin LED device is mounted.

In addition, a thickness of the first insulating film and second insulating film, which is the length in the x-axis direction, may be 5 nm to 2 μm, for example, 5 nm to 1 μm, or 5 to 100 nm.

In addition, the ultra-thin fin LED device may have the length of 1 to 10 μm, and the thickness of 0.1 to 3 μm.

In addition, a ratio of the length and thickness of the ultra-thin fin LED device is 3:1 or more.

In addition, an emission area of the micro-thin fin LED device may exceed twice an area of a vertical cross-section of the device unit.

In addition, the ultra-thin fin LED device may be used for an electric field array assembly in which the LED device is mounted on different electrodes through self-alignment by electric field induction arrangement.

In addition, one of the first conductive semiconductor layer and the second conductive semiconductor layer may include a p-type GaN semiconductor layer, and the other may include an n-type GaN semiconductor layer, the p-type GaN semiconductor layer may have a thickness of 10 to 350 nm, and the n-type GaN semiconductor layer may have a thickness of 1000 to 3000 nm, and a thickness of the photoactive layer may have a thickness of 30 to 200 nm.

In addition, the present invention provides an ultra-thin fin LED electrode assembly, including a mounting electrode line that extends in a first direction and includes first and second mounting electrodes spaced apart from each other in a second direction different from the first direction, and a plurality of the ultra-thin fin LED devices according to the present invention in which the first handle electrode at one end in a longitudinal direction is electrically connected to the first mounting electrode, and the second handle electrode at the other end in the longitudinal direction is electrically connected to the second mounting electrode.

In addition, the present invention provides an ultra-thin fin LED electrode assembly, including an alignment electrode line that includes a first alignment electrode and a second alignment electrode extends in a first direction and spaced apart from each other in a second direction different from the first direction, an insulating layer that is formed to cover an upper portion of the alignment electrode line, a plurality of the ultra-thin fin LED devices according to the present invention in which the first handle electrode at one end in a longitudinal direction is positioned on the insulating layer corresponding to an upper portion of the first alignment electrode, and the second handle electrode at the other end in the longitudinal direction is positioned on the insulating layer corresponding to an upper portion of the second alignment electrode, and a driving electrode line that includes a first driving electrode formed to be electrically connected to the first handle electrode and a second driving electrode formed to be electrically connected to the second handle electrode.

Hereinafter, the terms used in the present invention will be defined.

In descriptions of embodiments of the present invention, it should be understood that when a layer, region, pattern, or structure is referred to as being formed "on," "upper", "above," "under," "lower", "below" another layer, another region, or another pattern, the terminology of "on," "upper", "above," "under," "lower", "below" includes both the meanings of "directly" and "indirectly".

DETAILED DESCRIPTION OF THE INVENTION

Hereinafter, embodiments of the present invention will be described in detail with reference to the accompanying drawings such that those skilled in the art to which the present invention can easily carry out the present invention. It should be understood that the present invention may be embodied in various different forms and is not limited to the following embodiments.

Figure 1A:
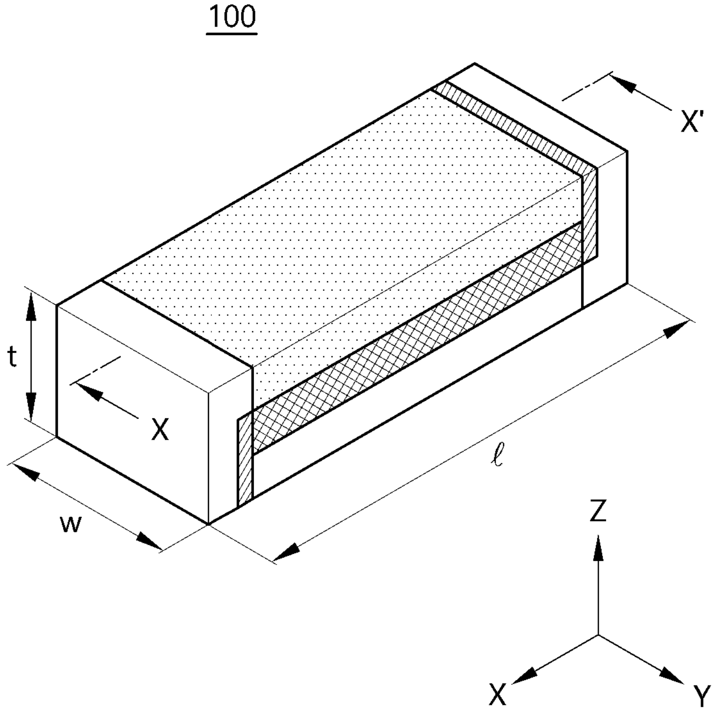
FIGS. 1*a* and 1*b* are a perspective view of an ultra-thin fin LED device according to an embodiment of the present invention and a cross-sectional view taken along the boundary line X-X'.
Figure 1B:
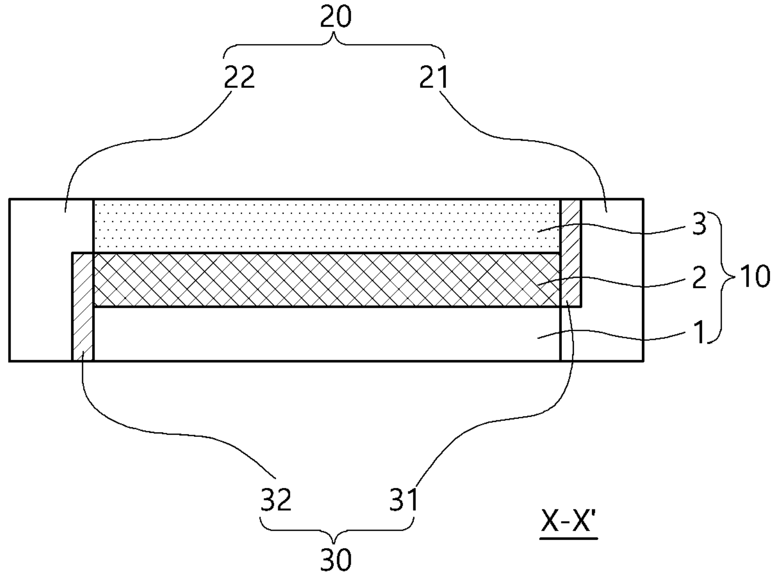
Figure 2A:
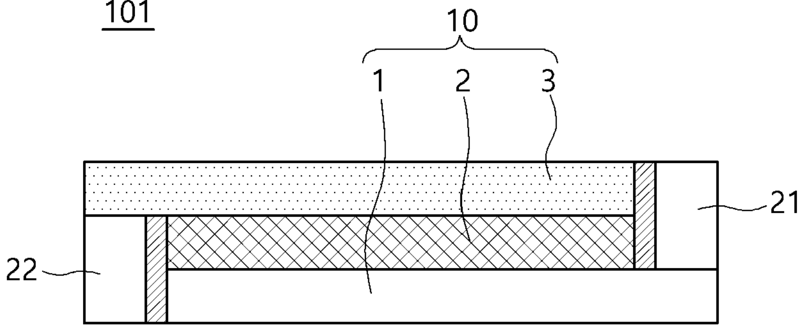
FIGS. 2*a* to 4 are cross-sectional views parallel to a longitudinal direction of an ultra-thin fin LED device according to various embodiments of the present invention.
Figure 2B:
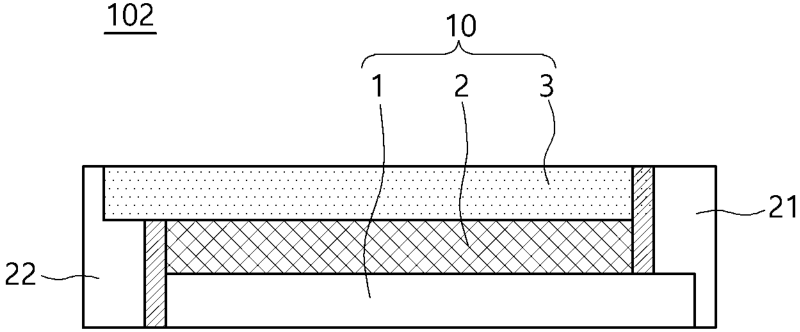

Referring to FIGS. 1*a* to 1*b*, assuming that based on the mutually perpendicular x, y, and z axes, the x-axis direction is the length, the y-axis direction is the width, and the z-axis direction is the thickness, an ultra-thin fin LED device 100 has a rod-type in which the length is longer than the width and thickness so the length becomes a major axis, and includes a device unit 10 in which a first conductive semiconductor layer 1, a photoactive layer 2, and a second conductive semiconductor layer 3 are sequentially stacked in the z-axis direction, which is a thickness direction, and an electrode unit 20 that includes a first handle electrode 21 formed to at least partially cover one end surface of the device unit 10 in the x-axis direction and a second handle electrode 22 formed to at least partially cover the other end surface opposite to the one end surface. In addition, the first handle electrode 21 is formed to be electrically connected only to the first conductive semiconductor layer 1 among the first conductive semiconductor layer 1, the photoactive layer 2, and the second conductive semiconductor layer 3. The second handle electrode 22 is formed to be electrically connected only to the second conductive semiconductor layer 3 among the first conductive semiconductor layer 1, the photoactive layer 2, and the second conductive semiconductor layer 3.

More specifically, the device unit 10 has a predetermined shape on the x-y plane consisting of a length (f) and a width (w), the z-axis direction perpendicular to the plane becomes the thickness (t) direction, and each layer constituting the LED device is stacked in the thickness direction. The device unit 10 having such a structure has an advantage in that it can secure a wider emission area through the x-y plane consisting of the length and width even if the thickness of the portion of the photoactive layer 2 exposed on the side surface is thin. In addition, due to this, the emission area of the ultra-thin fin LED device 100 according to an embodiment of the present invention, that is, the emission area of the device unit 10 may exceed twice the area of the longitudinal cross-section of the device unit 10. Here, the longitudinal cross-section is a cross-section parallel to the x-axis direction, which is the longitudinal direction, and may be the x-y plane when the width of the device unit 10 is constant.

Figure 5A:
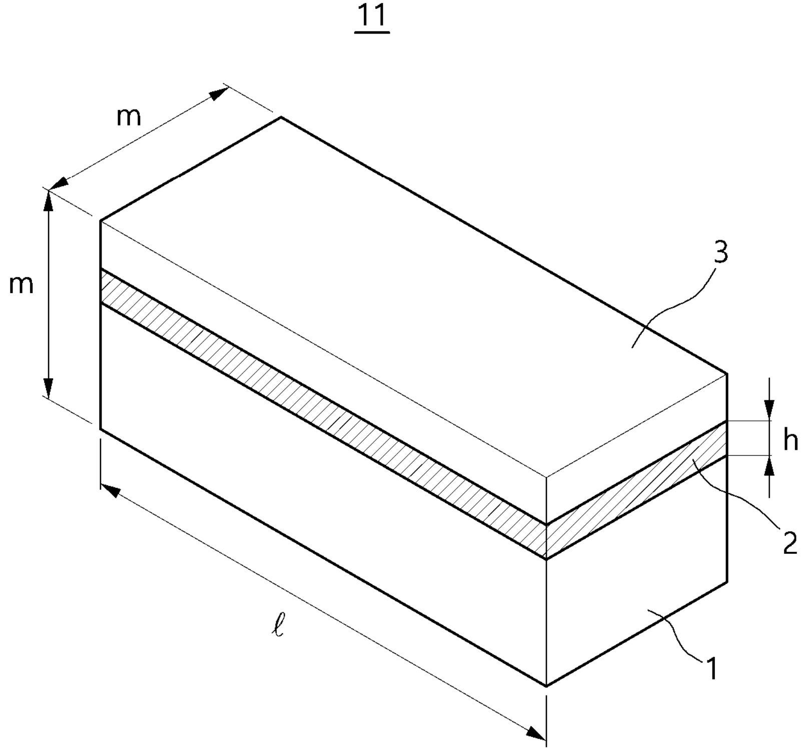
FIGS. 5*a* and 5*b* are a schematic view of a first rod-type device in which a first conductive semiconductor layer, a photoactive layer, and a second conductive semiconductor layer are stacked in a thickness direction, and a schematic view of a second rod-type device in which a first conductive semiconductor layer, a photoactive layer, and a second conductive semiconductor layer are stacked in a longitudinal direction, respectively.
Figure 5B:
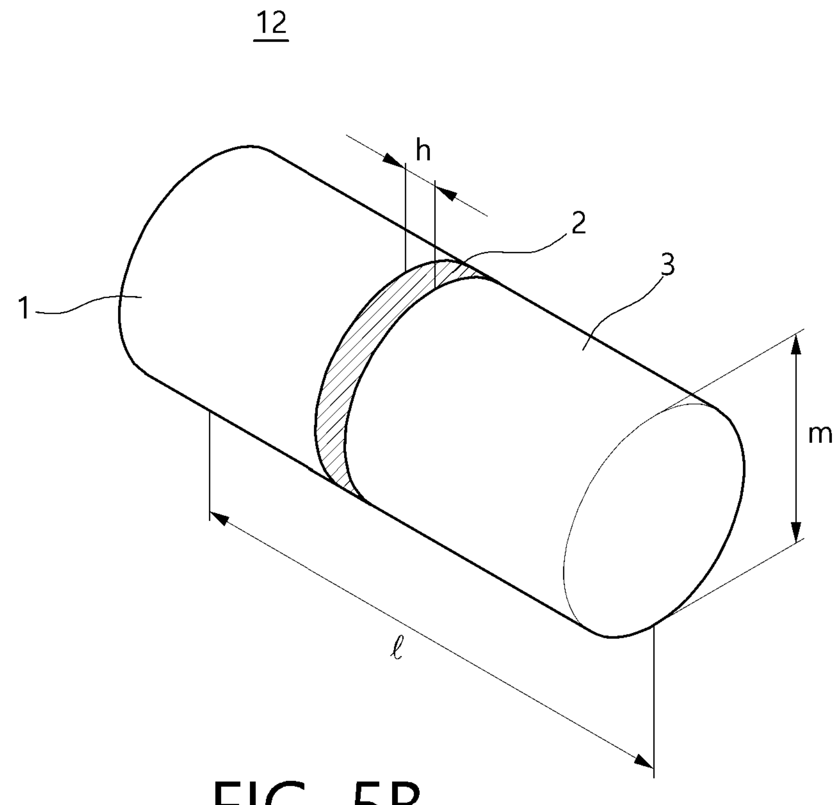

Specifically, referring to FIGS. 5*a* and 5*b*, a first rod-type device 11 illustrated in FIG. 5*a* and a second rod-type device 12 illustrated in FIG. 5*b* are both rod-type devices which have a structure in which the first conductive semiconductor layer 1, the photoactive layer 2, and the second conductive semiconductor layer 3 are stacked, have the same length (f) and thickness (or diameter) (m), and have the same thickness (h) of the photoactive layer. However, the first rod-type device 11 and the second rod-type device 12 are structurally different from each other. That is, in the first rod-type device 11, the first conductive semiconductor layer 1, the photoactive layer 2, and the second conductive semiconductor layer 3 are stacked in the thickness direction of the device, whereas in the second rod-type device 12, the first conductive semiconductor layer 1, the photoactive layer 2, and the second conductive semiconductor layer 3 are stacked in the longitudinal direction of the device.

The two devices 11, 12 have a large difference in the emission area. Assuming that, for example, the length (l) is 4000 nm, the thickness (m) and width (or diameter) are 600 nm, and the thickness (h) of the photoactive layer 2 is 100 nm, the ratio of the surface area (which corresponds the emission area) of the photoactive layer 2 of the first rod-type element 11 and the surface area of the photoactive layer 2 of the second rod-type element 12 is 5.72 $\mu m^2$: 0.75 $\mu m^2$. Thus, the emission area of the first rod-type element 11 is 7.63 times larger than that of the second rod-type device 12. In addition, the ratio of the surface area of the photoactive layer 2 exposed to the outside of the total emission area of the photoactive layer 2 is about 25% for the second rod-type device 12, which is about 1.6 times larger compared to the ratio of the surface area of the photoactive layer 2 exposed to the outside in the first rod-type device 11. Thus, the effect on excitons due to surface defects of the exposed photoactive layer 2 is much reduced in the first rod-type element 11 compared to the second rod-type element 12. Thus, since the first rod-type device 11, which corresponds to the device unit 10 of the ultra-thin fin LED device, has a much smaller effect of surface defects on excitons compared to the second rod-type device 12, which is a horizontally arranged rod-type device. Therefore, it can be evaluated that the first rod-type device 11 is significantly superior to the second rod-type device 12, in terms of luminous efficiency and luminance. In addition, the second rod-type device 12 is implemented by etching a wafer on which a conductive semiconductor layer and a photoactive layer are stacked in the thickness direction in the thickness direction. As a result, a long length of the device corresponds to the wafer thickness. In order to increase the length of the device, an increase in the etched depth is unavoidable. The greater the etch depth, the higher the possibility of defects on the device surface. As a result, even if the area of the exposed photoactive layer 2 is small compared to the first rod-type device 11, the second rod-type device 12 has a higher possibility of surface defects. Thus, considering that the luminous efficiency decreases due to the increase in the possibility of surface defects, it may be expected that the first rod-type device 11 can be significantly superior in luminous efficiency and luminance.

Furthermore, a movement distance of the holes injected from any one of the first conductive semiconductor layer 1 and the second conductive semiconductor layer 3 and the electrons injected from the other one in the first rod-type device 11 is shorter than the movement distance in the second rod-type device 12, so that the probability of electrons and/or holes being captured by surface defects during electron and/or hole movement is reduced, thereby minimizing emission loss, and advantageously minimizing emission loss due to electron-hole velocity imbalance. In addition, in the case of the second rod-type device 12, a strong optical path behavior occurs due to the circular rod-type structure, so the path of the light generated by electron-holes resonates in the longitudinal direction, so that light is emitted from both ends in the longitudinal direction, and thus, a front luminous efficiency is not good due to the strong side luminous profile when the devices are arranged to be placed lying down. On the other hand, in the case of the first rod-type device 11, light is emitted from the upper and lower surfaces, so there is an advantage of expressing excellent front luminous efficiency.

Therefore, the ultra-thin fin LED device 100 of the present invention is implemented so that the conductive semiconductor layers 1, 3 and the photoactive layer 2 are staked in the thickness direction and the length is longer than the thickness, as in the above-described first rod-type device 11, thereby having a more improved emission area. Furthermore, even if the area of the exposed photoactive layer 2 is slightly increased, as the thicknesses of the layers to be implemented in the process of manufacturing the device unit 10 is thin, the etched depth is shallow, so that in the final etching process, the defect occurrence on the exposed surfaces of the photoactive layer 2 and the conductive semiconductor layers 1, 3 is reduced, and it is advantageous to minimize or prevent a degradation in luminous efficiency due to the surface defects.

Meanwhile, although the x-y plane is illustrated as a rectangle in FIGS. 1*a* and 1*b*, it is not limited thereto, and it is noted that the shape can be employed without limitation, from general rectangular shapes such as rhombus, parallelogram, trapezoid, etc. to oval, etc.

In addition, the device unit 10 according to an embodiment of the present invention has a size of micro or nano units in length and width. For example, the device unit 10 may have a length of 1000 to 10000 nm, and a width of 250 to 1500 nm. In addition, the thickness may be 100 to 3000 nm. The standard of the length and width may be different depending on the shape of the plane. For example, when the x-y plane is a rhombus or a parallelogram, one of the two diagonals may be the length and the other may be the width, and in the case of a trapezoid, the longest of the height, upper and lower side surfaces may be the length, and the shorter one perpendicular to the longer one may be the width. Alternatively, when the shape of the plane is an ellipse, the major axis of the ellipse may be the length and the minor axis may be the width.

Meanwhile, a ratio of the entire length including the length of the electrode unit 20 to be described later and thickness of the ultra-thin fin LED device 100 may be 3:1 or more, more preferably 6:1 or more, and thus the length may be greater than the thickness, and through this, there is the advantage in that the device can be self-aligned more easily on the electrode through an electric field. If the ratio of the entire length and thickness of the ultra-thin fin LED device 100 is reduced to less than 3:1, it may be difficult to self-align the device on the electrode through an electric field, and the device is not fixed on the electrode, so there is a possibility of an electrical contact short circuit caused by a processing defect. However, the ratio of the length and the thickness may be 15:1 or less, and through this, it may be advantageous to achieve the object of the present invention, such as optimization of a rotation torque that is self-alignment through an electric field.

In addition, the width of the device unit 10 may be greater than or equal to the thickness, through this, when the ultra-thin fin LED device 100 is aligned on two different electrodes by using an electric field, there is an advantage of minimizing or preventing alignment by lying on the side surface, that is, aligning the side surfaces of the device unit 10 to contact the two electrode. If the ultra-thin fin LED device 100 is aligned on its side surface, even if it is possible to prevent an electric short caused by the photoactive layer 2 exposed on the side surface contacting the electrode due to the electrode unit 20 to be described later, there is a risk that the emission on the front, which is the upper direction perpendicular to the two electrode surfaces, may be reduced.

Meanwhile, the device unit 10 may be a device having different sizes at both ends in the longitudinal direction, for example, a rod-type device having a rectangular plane of an equilateral trapezoid whose length, i.e., height is greater than the upper and lower side surfaces. Depending on the length difference between the upper side surface and the lower side surface, a difference between positive and negative charges accumulated at both ends of the device in the longitudinal direction may occur as a result which may make the self-alignment of the ultra-thin fin LED device 100 by an electric field easier.

Hereinafter, each layer included in the device unit 10 will be described.

The device unit 10 includes a first conductive semiconductor layer 1 and a second conductive semiconductor layer 3. A conductive semiconductor layer employed in a typical LED device used for a light, a display, and the like may be used as the used conductive semiconductor layer, without limitation. According to a preferred embodiment of the present invention, any one of the first conductive semiconductor layer 1 and the second conductive semiconductor layer 3 may include at least one n-type semiconductor layer, and the other conductive semiconductor layer may include at least one p-type semiconductor.

When the first conductive semiconductor layer 1 includes an n-type semiconductor layer, the n-type semiconductor layer may include a semiconductor material having an empirical formula of $In_xAl_yGa_{1-x-y}N$ ($0 \le x \le 1$, $0 \le y \le 1$, $0 \le x+y \le 1$), for example, at least one selected from among InAlGaN, GaN, AlGaN, InGaN, AN, InN, and the like and may be doped with a first conductive dopant (for example, Si, Ge, Sn, etc.). According to one preferred embodiment of the present invention, the first conductive semiconductor layer 1 including the n-type semiconductor layer may have a thickness of 1 to 3 μm, but is not limited thereto.

When the second conductive semiconductor layer 3 includes a p-type semiconductor layer, the p-type semiconductor layer may include a semiconductor material having an empirical formula of $In_xAl_yGa_{1-x-y}N$ ($0 \le x \le 1$, $0 \le y \le 1$, and $0 \le x+y \le 1$), for example, at least one selected from among InAlGaN, GaN, AlGaN, InGaN, AlN, InN, and the like, and may be doped with a second conductive dopant (for example, Mg). According to one preferred embodiment of the present invention, the second conductive semiconductor layer 3 including the p-type semiconductor layer may have a thickness of 0.01 to 0.35 μm, but is not limited thereto.

According to an embodiment of the present invention, one of the first conductive semiconductor layer 1 and the second conductive semiconductor layer 3 includes a p-type GaN semiconductor layer, and the other includes an n-type GaN semiconductor layer, and the p-type GaN semiconductor layer may have a thickness of 10 to 350 nm, and the n-type GaN semiconductor layer may have a thickness of 1000 to 3000 nm, through which the movement distance of the holes injected into the p-type GaN semiconductor layer and the electrons inserted into the n-type GaN semiconductor layer is shorter compared to the rod-type device in which the semiconductor layer and the photoactive layer are stacked in the longitudinal direction as illustrated in FIG. 5*b*. Through this, the probability of electrons and/or holes being captured by the surface defects of the device during movement is reduced, thereby minimizing emission loss, and it may be advantageous to minimize emission loss due to electron-hole velocity imbalance.

Next, the photoactive layer 2 is formed on the first conductive semiconductor layer 1 and may be formed to have a single or multi-quantum well structure A photoactive layer included in a typical LED device used for a light, a display, and the like may be used as the photoactive layer 2 without limitation. A clad layer (not shown) doped with a conductive dopant may be formed on and/or below the photoactive layer 2, and the clad layer doped with the conductive dopant may be implemented as an AlGaN layer or an InAlGaN layer. In addition, a material such as AlGaN or AlInGaN may be used for the photoactive layer 2. In the photoactive layer 2, when an electric field is applied to the device, electrons and holes moving from the conductive semiconductor layers positioned on and below the photoactive layer to the photoactive layer are combined to generate electron-hole pairs in the photoactive layer, thereby emitting light According to one preferred embodiment of the present invention, the photoactive layer 2 may have a thickness of 30 to 300 nm, but is not limited thereto.

Figure 3A:
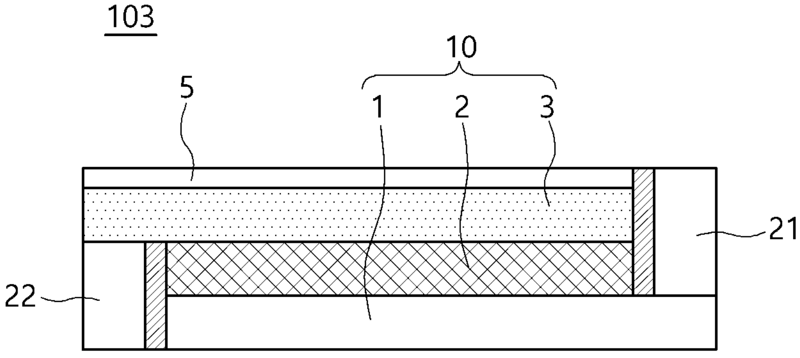
Figure 3B:
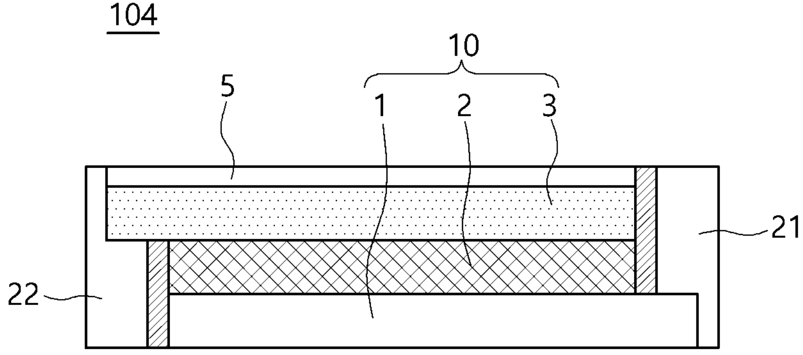
Figure 4:
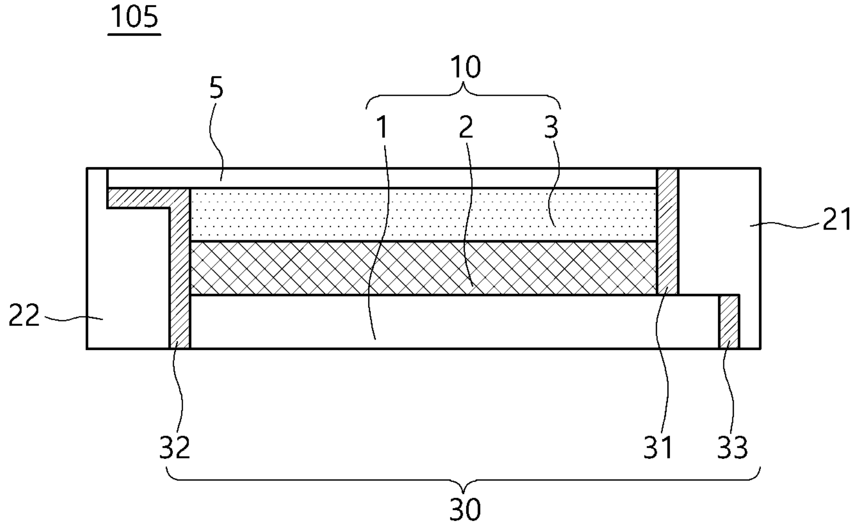

Next, an electrode layer may be further formed on the lower surface of the first conductive semiconductor layer 1 and/or the upper surface of the second conductive semiconductor layer 3. Specifically, a first electrode layer may be provided on the lower surface of the first conductive semiconductor layer 1, and a second electrode layer may be provided on the upper surface of the second conductive semiconductor layer 3. In this case, depending on the shape and structure of the designed electrode unit 20, the first electrode layer or the second electrode layer is indirectly electrically connected to a first handle electrode 21 or a second handle electrode 22 via the first conductive semiconductor layer 1 or the second conductive semiconductor layer 2. For example, in the case of FIG. 3*a*, the second electrode layer 5 is indirectly electrically connected to the second handle electrode 22 via the second conductive semiconductor layer 3. Alternatively, the electrode layer may be directly electrically connected to any one handle electrode, and as an example, the second electrode layer 5 may be directly electrically connected to the second handle electrode 22 as illustrated in FIGS. 3*b* and 4.

The first electrode layer or the second electrode layer 5 is for improving the electrical connectivity between the device unit 10 and the electrode unit 20 to be described later and/or the electrical connectivity between an electrode line on which the ultra-thin fin LED device 100 is mounted and the first conductive semiconductor layer 1 or second conductive semiconductor layer 3 of the device unit 10. An electrode layer included in a typical LED device used for a light, a display, and the like may be used as the first or second electrode layer 5 without limitation. The first or second electrode layer 5 may be independently made of Cr, Ti, Al, Au, Ni, ITO, and an oxide or alloy thereof alone or in combination, but the first or second electrode layer 5 may preferably be a transparent material in order to minimize emission loss. An example may be the ITO. In addition, the thickness of the first or second electrode layer 5 may be 50 to 500 nm, but is not limited thereto.

In addition, the above-described first conductive semiconductor layer 1, photoactive layer 2, and second conductive semiconductor layer 3 may be included as the minimum components of the ultra-thin fin LED device 100, and other active layers, conductive semiconductive layers, phosphor layers, hole block layers, and/or electrode layers above and below each layer may be further included.

Meanwhile, according to an embodiment of the present invention, the device unit 10 may further include a protective film (not shown) formed on both side surfaces to cover the exposed surface of the photoactive layer 2. The protective film is a film for protecting the exposed surface of the photoactive layer 2, and may cover at least all the exposed surfaces of the photoactive layer 2 and both side surfaces of the device unit 10 except for a front end and a rear end. The protective film may preferably include at least one from among silicon nitride ($Si_3N_4$), silicon dioxide ($SiO_2$), aluminum oxide ($Al_2O_3$), hafnium oxide ($HfO_2$), zirconium oxide ($ZrO_2$), yttrium oxide ($Y_2O_3$), titanium dioxide ($TiO_2$), aluminum nitride (AlN), and gallium nitride (GaN), more preferably the material made of the above component, or may be transparent, but is not limited thereto. According to a preferred embodiment of the present invention, the thickness of the protective film may be 5 to 100 nm, but is not limited thereto.

Next, the electrode unit 20 covering at least a portion of both ends of the device unit 10 in the x-axis direction will be described.

The electrode unit 20 includes the first handle electrode 21 formed to at least partially cover one end surface of the device unit 10 in the x-axis direction and the second handle electrode 22 formed to at least partially cover the other end surface opposite to the one end surface. The first handle electrode 21 is electrically connected only to the first conductive semiconductor layer 1 among the first conductive semiconductor layer 1, the photoactive layer 2, and the second conductive semiconductor layer 3. The second handle electrode 22 is electrically connected only to the second conductive semiconductor layer 3 among the first conductive semiconductor layer 1, the photoactive layer 2, and the second conductive semiconductor layer 3.

The electrode unit 20 is formed on an end surface in the longitudinal direction perpendicular to the stacking direction of the layers constituting the LED device. Considering that, in the case of a typical LED device, a power supply direction from an outside to the LED device coincides with the stacking direction of the layers, it is difficult to find the electrode unit 20 disposed on the device unit 10 in the same structure as the present invention in known LED devices, and there is no reason to provide the electrode unit with such a structure in a typical LED device. Particularly, when a pair of electrodes is formed to cover the end surface perpendicular to the stacking direction of the layers constituting the device unit 10, there may be an electrical short between the photoactive layer 2 exposed on the end surface of the device unit 10 and the electrode when applying power to the pair of electrodes for driving the LED device. This is even more so in that the LED device cannot be driven because both (+) and (−) powers are applied to the first conductive semiconductor layer 1 and the second conductive semiconductor layer 3.

The present invention provides the electrode unit 20 on a cross section perpendicular to the stacking direction of the layers, unlike a typical LED device, for the following reasons. As the size of the display unit 10 is very small, it is difficult to mount each device on an electrode one by one using a machine or the like. Therefore, it is necessary to mount the device through another method, and even if the device is placed on the electrode using an electric field, the device may not emit light depending on the alignment surface of the device, that is, the surface of the device that contacts the electrode. Accordingly, the number of light-emitting LED devices may be small compared to the number of input LED devices or the number of LED devices mounted on the electrode, so it may not be possible to secure sufficient luminance. Whenever self-alignment is performed, the number of light-emitting LED devices is determined probabilistically, and the number of light-emitting LED devices may vary, making it difficult to guarantee luminance uniformity. In addition, there is a problem of an increase in manufacturing cost due to the LED devices that do not emit light on the electrode.

Figure 6:
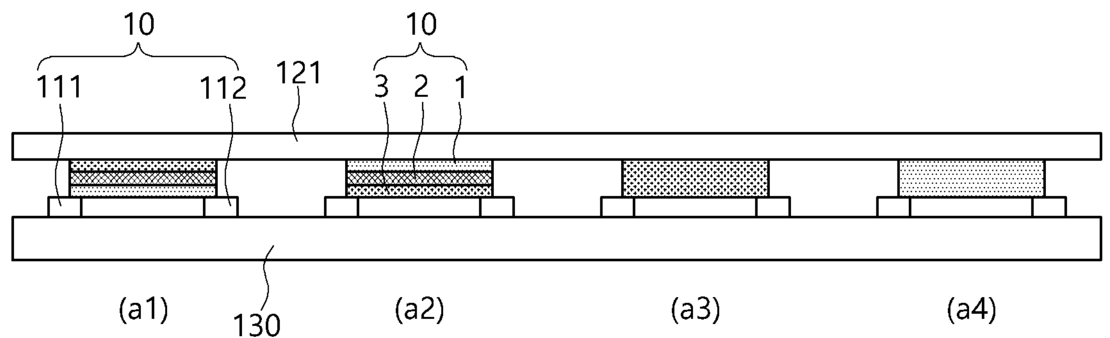
FIGS. 6 and 7 are cross-sectional schematic views of an electrode assembly in which a rod-type LED device according to a comparative example of the present invention, which does not have a handle electrode, is disposed on an electrode with different alignment surfaces.

Specifically, FIG. 6 illustrates a cross-sectional view of an electrode assembly in which the device unit 10 corresponding to a rod-type LED device is disposed between the vertical driving electrode lines spaced up and down, that is, a lower driving electrode 110 and an upper driving electrode 121. In this figure, when the device unit 10 is self-aligned using an electric field, the device unit 10 is disposed over a first mounting electrode 111 and a second mounting electrode 112 formed to be spaced apart on a substrate 130. In this case, the device unit 10 may be mounted with different alignment surfaces in the number of four cases. First, in the case of mounting type 1 (a1), the first conductive semiconductor layer 1 of the device unit 10 becomes an alignment surface and is disposed so as to be in contact with the first mounting electrode 111 and the second mounting electrode 112, and as an upper driving electrode 121 is disposed in contact with the second conductive semiconductor layer 3, the mounting type 1 can normally emit light by the power applied to the lower driving electrode 110 and the upper driving electrode 121. In addition, in the case of mounting type 2 (a2), the alignment surface of the device unit 10 becomes the second conductive semiconductor layer 3, and the mounting type 2 is a mounting type in which light is normally emitted like mounting type 1 (a1). However, in the case of mounting type 3 (a3) and mounting type 4 (a4), both side surfaces of the device unit 10 are the alignment surfaces, respectively. Thus, even though the device unit is mounted to be positioned between the lower driving electrode 110 and the upper driving electrode 121, the mounting types 3 and 4 do not emit light when power is applied to the upper driving electrode 121 and the lower driving electrode 110.

In other words, when the plurality of device units 10 is put on the first mounting electrode 111 and the second mounting electrode 112 and then self-aligned using an electric field, half of the device units 10 out of the plurality of device units may be mounted in a light-emitting state, and it may be difficult to obtain a desired level of luminance compared to the number of input device units 10. In addition, since the alignment surface can be determined probabilistically, the number of device units 10 mounted in a light-emitting state may be different each time self-alignment is performed, and thus there is a problem that quality uniformity may be deteriorated.

Figure 7:
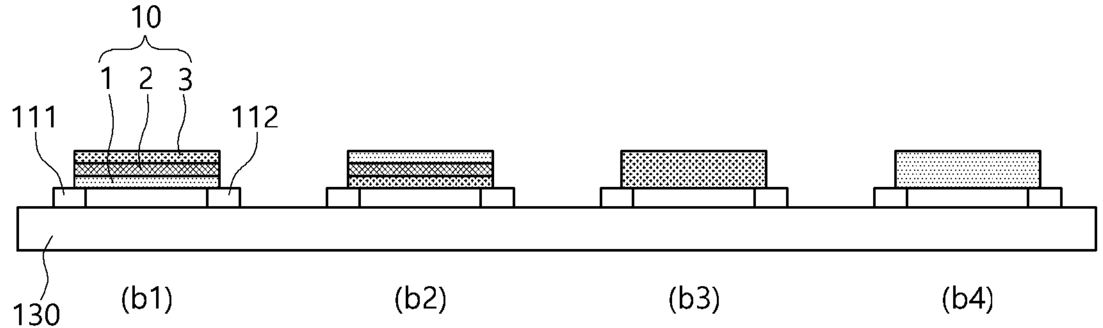

Also, FIG. 7 illustrates four mounting types b1, b2, b3, and b4 according to the alignment surface of the device unit 10 in the electrode line having a structure different from that of FIG. 6. When the device unit 10 is self-aligned through an electric field using the first mounting electrode 111 and the second mounting electrode 112, the mounting type is different in four cases as described in FIG. 6. In a horizontal driving electrode line using the first mounting electrode 111 and the second mounting electrode 112 used as different driving electrodes, there is a problem in that none of the device units 10 among the four mounting types emit light.

However, the electrode unit 20 is formed to include the first handle electrode 21 formed to at least partially cover one end surface of the device unit 10 in the x-axis direction and the second handle electrode 22 formed to at least partially cover the other end surface opposite to the one end surface. When the first handle electrode 21 is electrically connected only to the first conductive semiconductor layer 1 among the first conductive semiconductor layer 1, the photoactive layer 2, and the second conductive semiconductor layer 3, and the second handle electrode 22 is electrically connected only to the second conductive semiconductor layer 3 among the first conductive semiconductor layer 1, the photoactive layer 2, and the second conductive semiconductor layer 3, there is an advantage that the electrode assembly can be implemented so that all ultra-thin fin LED devices 100 mounted regardless of the alignment surface of the device unit 10 emit light.

In addition, in preparation for a case in which the driving electrode line and the device unit 10 are directly electrically connected, there is an advantage in that the contact resistance can be reduced.

Figure 8:
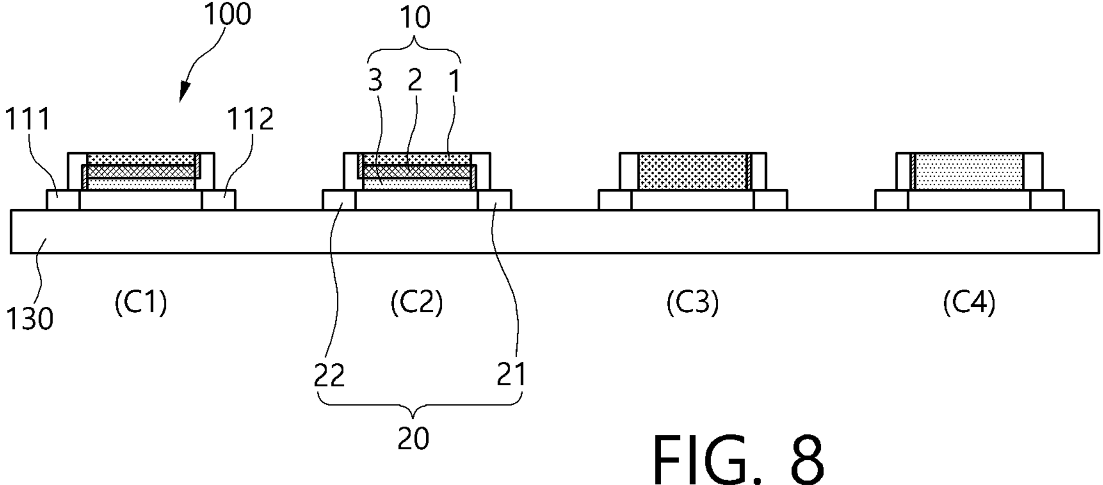
FIGS. 8 and 9 are cross-sectional schematic views of an ultra-thin fin LED electrode assembly according to various embodiments of the present invention.

Specifically, FIG. 8 illustrates a case in which an electrode assembly is implemented using an electrode line having the same structure as that of FIG. 7. As the ultra-thin fin LED device 100 having the electrode unit 20 provided to satisfy the above conditions is used, the ultra-thin fin LED device 100 in all four mounting types (c1, c2, c3, c4) can emit light regardless of the alignment surface.

An electrode material used in an LED device may be used as the first handle electrode 21 and second handle electrode 22 included in the electrode unit 20 without limitation. For example, the electrode material may include at least one selected from the group consisting of Cr, Ti, Al, Au, and Ni. In this case, it is noted that when the electrode material is made of two or more materials, two or more materials may be mixed in one layer or form an alloy, and each material may be configured to form a layer or region. In addition, the lengths of the first handle electrode 21 and second handle electrode 22 in the x-axis direction may be provided to be 0.1 μm or more, and in another example, the lengths may be provided to be 100 μm or less. Through this, it can be easier to control the width between electrodes when designing the mounting electrode line or the driving electrode line.

When the first handle electrode 21 and the second handle electrode 22 are respectively formed to cover at least a portion of an end surface in the longitudinal direction of the device unit 10 and electrically connected only to the first conductive semiconductor layer 1 and the second conductive semiconductor layer 3 among the first conductive semiconductor layer, the photoactive layer 2, and the second conductive semiconductor layer 3, there is no limitation on a specific formation form.

For example, it may further include an insulating unit 30 including a first insulating film 31 interposed between the first handle electrode and a portion corresponding to the photoactive layer and the second conductive semiconductor layer on one end surface of the device unit in the x-axis direction so that the first handle electrode is electrically connected only to the first conductive semiconductor layer 31, and a second insulating film 32 interposed between the second handle electrode and a portion corresponding to the photoactive layer and the first conductive semiconductor layer on the other end surface of the device unit in the x-axis direction so that the second handle electrode is electrically connected only to the second conductive semiconductor layer. The first insulating film 31 and the second insulating film 32 may be formed of a known insulating material. For example, the first and second insulating films 31, 32 may include at least one from among silicon nitride ($Si_3N_4$), silicon dioxide ($SiO_2$), aluminum oxide ($AbO_3$), hafnium oxide ($HfO_2$), zirconium oxide ($ZrO_2$), yttrium oxide ($Y_2O_3$), titanium dioxide ($TiO_2$), aluminum nitride (AlN), and gallium nitride (GaN). In addition, the length of the first insulating film 31 and the second insulating film 32 in the x-axis direction may be 5 to 100 nm. When the length is less than 5 nm, it may be difficult to maintain an electrically disconnected state between any one of the handle electrodes and the conductive semiconductor layer and/or the photoactive layer through the insulating film. In addition, when the length exceeds 100 nm, there is a risk that the volume of the handle electrode is relatively reduced.

On the other hand, in the ultra-thin fin LED device according to an embodiment of the present invention, in order to increase the contact area between any one end surface or both end surfaces of both ends of the device unit the x-axis direction and any one handle electrode or two handle electrodes, the end surface of the device unit may have a step formed by protruding any layer constituting the device unit.

Referring to FIGS. 2*a* to 3*b*, one end surface of the device unit 10 in the x-axis direction has a step formed by protruding the first conductive semiconductor layer 1, and the other end thereof may have a step so that the second conductive semiconductor layer 3 and/or the second electrode layer 5 protrudes. Through this, the contact area between the first handle electrode 21 and the first conductive semiconductor layer 1, the second handle electrode 22 and the second electrode layer 5, and/or the second handle electrode 22 and the second electrode layer 5 is increased, and thus, electrical connectivity can be improved, and the adhesion of the first handle electrode 21 and second handle electrode 22 can be further improved. In this case, since the length of the conductive semiconductor layer protruding from each end of the device unit 10 in the x-axis direction may vary depending on the purpose, the present invention is not particularly limited thereto. Meanwhile, as illustrated in FIGS. 2*b* and 3*b*, the first handle electrode 21 and the second handle electrode 22 may be formed to cover both the end surfaces of the first conductive semiconductor layer 1 and second conductive semiconductor layer 3, which may be more advantageous in preventing surface defects that may occur when the surface of the conductive semiconductor layer is exposed to the outside.

The ultra-thin fin LED device 100, 101, 102, 103, 104, 105 according to an embodiment of the present invention described above may be manufactured by a manufacturing method described below, but is not limited thereto. For example, the ultra-thin fin LED device 100, 101, 102, 103, 104, 105 may be manufactured by the steps of preparing an LED wafer in which the first conductive semiconductor layer 1, the photoactive layer 2, and the second conductive semiconductor layer 3 are stacked on a substrate 9; forming a plurality of device pillars by etching the LED wafer in the thickness direction so that each device has a plane having a predetermined shape, and the thickness perpendicular to the plane is smaller than a length of the plane; forming the first handle electrode 21 to be electrically connected to the first conductive semiconductor layer 1 on either end of the front end and rear end of each device pillar in the longitudinal direction while electrically disconnecting the first handle electrode 21 and the photoactive layer 2 and the second conductive semiconductor layers 3 by forming the first insulating film 31 between the first handle electrode 21 and the photoactive layer 2 and the second conductive semiconductor layers 3; attaching a support substrate on the second conductive semiconductor layer and then separating the bottom surfaces of the plurality of device pillars having the first handle electrode 21 on one end thereof from the wafer; forming the second handle electrode 22 to be electrically connected to the second conductive semiconductor layer 3 on the other end opposite to the one end in which the first handle electrode 21 is formed in the plurality of device pillars while electrically disconnecting the second handle electrode 22 and the photoactive layer 2 and the first conductive semiconductor layer 1 by forming the second insulating film 32 between the second handle electrode 22 and the photoactive layer 2 and the first conductive semiconductor layer and separating the support substrate.

As an example, a method for manufacturing the ultra-thin fin LED device 105 illustrated in FIG. 4 will be described in detail with reference to FIGS. 10 and 11.

Figure 10:
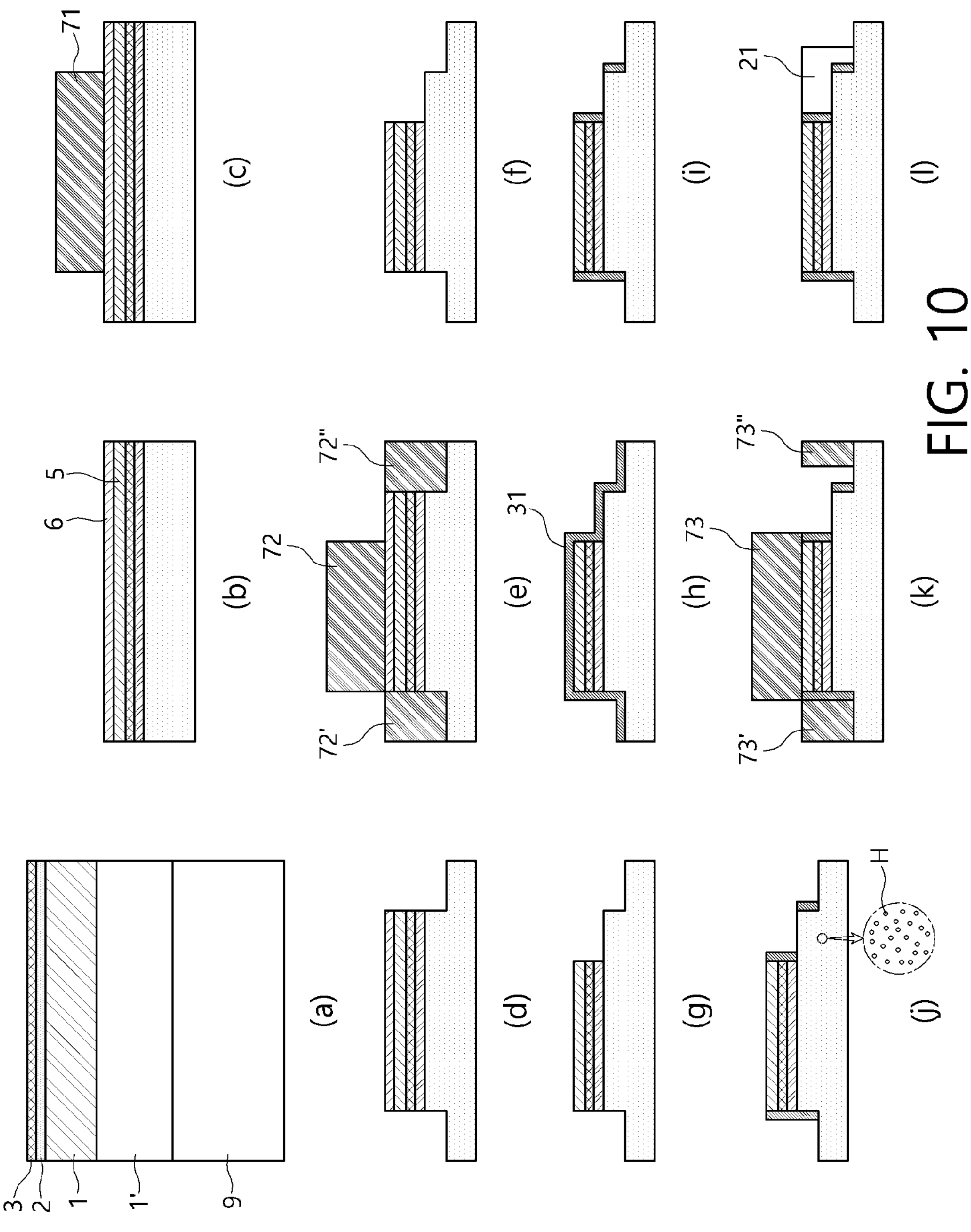
FIGS. 10 and 11 are process schematic views illustrating a method for manufacturing the ultra-thin fin LED device according to FIG. 4.

FIG. 10(*a*) illustrates a typical LED wafer. As the typical LED wafer, commercially available LED wafers may be used without limitation. In this case, in the LED wafer, the first conductive semiconductor layer 1, the photoactive layer 2, and the second conductive semiconductor layer 3 are stacked on the substrate 9, and an undoped conductive semiconductor layer 1' may be further provided between the substrate 9 and the conductive semiconductor layers 1, depending on the type of the LED wafer. In this case, for example, the first conductive semiconductor layer 1 may be an n-type semiconductor layer, more specifically, an n-GaN layer, and the second conductive semiconductor layer 3 may be a p-type semiconductor layer, more specifically, a p-GaN layer. In addition, the thickness of the first conductive semiconductor layer 1 on the LED wafer may be thicker than the thickness of the first conductive semiconductor layer 1 in the above-described ultra-thin fin LED device. In addition, each layer in the LED wafer may have a c-plane crystal structure. In addition, the LED wafer may have been subjected to a cleaning process, and since a cleaning process and cleaning solution of a typical wafer may be appropriately applied in the cleaning process, the present invention is not particularly limited thereto. The cleaning solution may be, for example, isopropyl alcohol, acetone, and hydrochloric acid but is not limited thereto.

Next, after forming the second electrode layer 5 on the second conductive semiconductor layer 3 of the prepared LED wafer, as illustrated in FIG. 10(*b*), the step of forming a hard mask layer 6 may be performed.

The second electrode layer 5 may be formed through a typical method of forming an electrode on a semiconductor layer and may be formed by, for example, deposition through sputtering. The material of the second electrode layer 5 may be, for example, ITO as described above or a composite electrode layer in which ITO and Ni are stacked, and the second electrode layer 5 may be formed to have a thickness of about 150 to 200 nm. The second electrode layer 5 may be further subjected to a rapid thermal annealing process after a deposition process. As an example, the second electrode layer 5 may be processed at a temperature of 600° C. for 10 minutes, but since the process may be appropriately adjusted in consideration of the thickness, material, etc. of the electrode layer, the present invention is not particularly limited thereto.

In addition, the hard mask layer 6 for wet etching of the LED wafer may be formed on the second electrode layer 5, and the material of the hard mask layer 6 may be, for example, silicon dioxide. Also, the thickness of the hard mask layer 6 may be 0.5 to 3 μm, for example, 200 nm or less. The hard mask layer 6 may be formed through, for example, deposition.

Next, the step of etching the LED wafer in the thickness direction to form the plurality of device pillars so that each device has a plane having a predetermined shape, the thickness perpendicular to the plane is smaller than the length of the plane is performed.

To this end, specifically, as illustrated in FIG. 10(*c*), the step of forming a pattern layer 71 by patterning the upper surface of the hard mask layer 6 in the desired x-y plane shape and size of the device unit is performed. The pattern layer 71 may be formed through photolithography using a photosensitive material or may be a pattern formed through a known nanoimprinting method, laser interference lithography, electron beam lithography, or the like.

Thereafter, as illustrated in FIG. 10(*d*), the step of manufacturing the plurality of device pillars by etching the hard mask layer 6, the second electrode layer 5, and the LED wafer in the thickness direction along the pattern layer 71, and then removing the pattern layer 71 may be performed. The etching may be performed using a known etching method in consideration of the material of each layer. For example, the hard mask layer 6 may be etched using a dry etching such as reactive ion etching (RIE), and the second electrode layer 5 may be etched using a dry etching such as inductively coupled plasma (ICP). In addition, the LED wafer may be etched along the pattern layer 71. In this case, the etching may be performed through a typical dry etching method such as ICP. On the other hand, the LED wafer may be etched only to a desired partial thickness among the total thickness of the first conductive semiconductor layer 1 of the LED wafer, but is not limited thereto. The depth of etching may be appropriately determined in consideration of the thickness of the first conductive semiconductor layer in the LED wafer. However, the total depth etched may be smaller than the length of each device unit so that the longitudinal direction of the device unit becomes the long axis.

In addition, after the etching process is completed, the pattern layer 71 may be removed by a known method in consideration of the material of the pattern layer 71. When the pattern layer 71 is a photoresist layer, a removal solvent such as acetone is used to remove the pattern layer 71.

Next, the step of etching and removing a portion on the one end of each device pillar from the second electrode layer 5 to the photoactive layer 2 so that the first conductive semiconductor layer 1 on either end of the front end and rear end of each device pillar in the longitudinal direction forms a step to protrude in the longitudinal direction may be performed.

In order to etch and remove the portion in the thickness direction, first, as illustrated in FIG. 10(*e*), the upper surface of the portion to be etched may be patterned to expose. More specifically, an upper pattern layer 72 formed on the upper surface of the device pillar except for the portion, and side pattern layers 72', 72" for protecting the first conductive semiconductor layer exposed at the front and rear ends of the device pillar from etching may be formed. Afterwards, along the formed upper pattern layer, the exposed portion of the device pillar may be etched in the thickness direction to a thickness where the first conductive semiconductor layer is exposed. For example, the etching may be performed through a typical dry etching method such as ICP. After etching, the upper patterned layer 72 and the side patterned layers 72', 72" may be removed, and in this case, the removal is performed by an appropriate method in consideration of the materials of the upper patterned layer 72 and the side patterned layers 72'. 72". For example, in the case of a photoresist layer, the removal may be performed using a removal solvent such as acetone. FIG. 10(*f*) illustrates a device pillar in which a step is formed at one end of the device pillar so that the first conductive semiconductor layer 1 protrudes from the photoactive layer 2 and the second conductive semiconductor layer 3 in the longitudinal direction.

Next, the hard mask layer 6 formed on the upper surfaces of the plurality of device pillars may be removed, and the removal may be performed through wet etching. The wet etching is performed using a buffer oxide etchant (BOE), KOH, or the like. FIG. 10(*g*) illustrates the device pillar from which the hard mask layer 6 has been removed.

Thereafter, the step of forming the first handle electrode 21 to be electrically connected to the first conductive semiconductor layer 1 on one end of which a step is formed so that the first conductive semiconductor layer 1 protrudes from each device pillar, while electrically disconnecting by forming the first insulating film 31 between the first handle electrode 21 and the photoactive layer 2 and the second conductive semiconductor layer 3 may be performed.

As illustrated in FIG. 10(*h*), the first insulating film 31 to be formed first is deposited on the upper portion of the LED wafer to non-electrically connect between the first handle electrode 21 and the photoactive layer 2 and the second conductive semiconductor layer 3, and thus the first insulting film 31 may be formed to cover all the outer surfaces of the plurality of device pillars. The first insulating film 31 may be formed of any material that performs a typical insulating function without limitation, and may be formed by an appropriate method in consideration of the material. For example, an insulating film made of $SiO_2$ or $SiN_x$ material may be formed by deposition through PECVD. In addition, the first insulating film 31 may be formed such that the film formed on the side surfaces of the plurality of device pillars has a predetermined thickness. For example, the thickness of the first insulating film 31 formed on the side surfaces of the device pillars may be 0.5 to 100 nm. After the first insulating film 31 is formed, as illustrated in FIG. 10(*i*), the remaining portions may be removed except for the portion covering the side surfaces of the plurality of device pillars, and the removal may be performed by a dry method such as ICP, for example.

Figure 11:
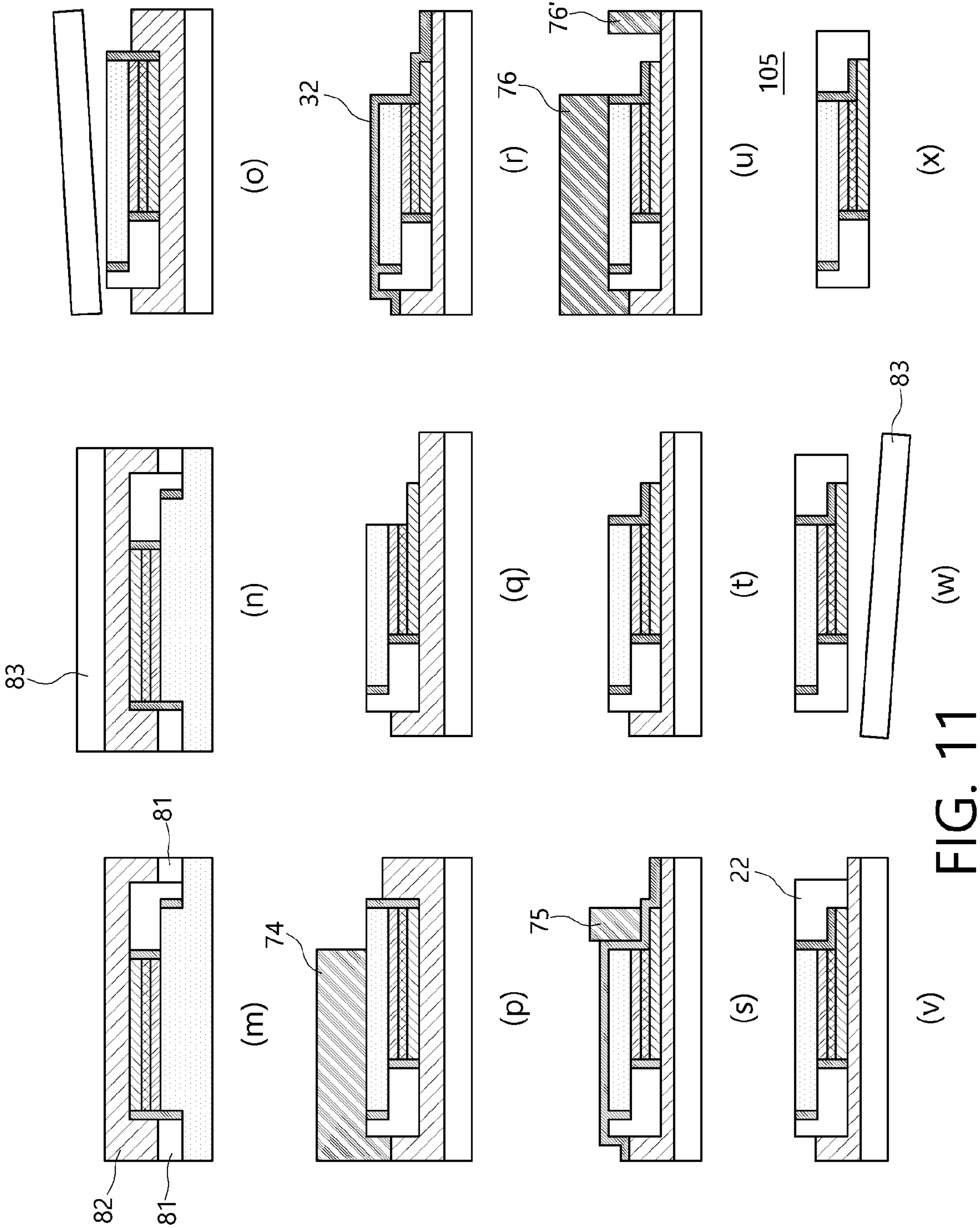

As a pre-processing step for separating the device pillar from the LED wafer as illustrated in FIG. 11(*o*) to be described later, the step of forming a plurality of pores H at the boundary of the portion of the first conductive semiconductor layer in the device pillar and a portion of the first conductive semiconductor layer in the LED wafer connected to the portion of the first conductive semiconductor layer is performed. Specifically, the plurality of pores H may be formed at the boundary portion by immersing the LED wafer on which the plurality of device pillars is formed as illustrated in FIG. 10(*i*) in an electrolyte, and then, electrically connecting the LED wafer to any one terminal of a power supply, and electrically connecting the other terminal of the power supply to a predetermined electrode immersed in the electrolyte, and then applying power.

In this case, in addition to the function of electrically disconnecting between the first handle electrode 21 to be formed later and the photoactive layer 2 and the second conductive semiconductor layer 3, at the same time, the first insulating film 31 formed on the side surface of the device pillar may serve as a protective film to prevent from the damage of pore formation in the portion of the first conductive semiconductor layer in the device pillar by preventing the electrolyte from coming into contact with the side surface of the portion of the first conductive semiconductor layer in the device pillar in this step.

On the other hand, the pore H is formed from the exposed portion of the first conductive semiconductor layer of the LED wafer that comes into direct contact with the electrolyte, to the thickness direction and side direction of the first conductive semiconductor layer of the LED wafer following the exposed portion. Thus, the pore may be finally formed in the portion of the first conductive semiconductor layer of the LED wafer following the lower portion of the portion of the first conductive semiconductor layer of each device pillar.

In this case, the electrolyte may be preferably oxygen acid, particularly, at least one selected from the group consisting of an oxalic acid, a phosphoric acid, a sulfurous acid, a sulfuric acid, a carbonic acid, an acetic acid, a chlorous acid, a chloric acid, a bromic acid, a nitrous acid, and a nitric acid, and more preferably, oxalic acid may be used. Therefore, there is an advantage suitable for forming the pores H without damage to the device pillars In addition, the predetermined electrode may be made of platinum (Pt), carbon (C), nickel (Ni), gold (Au), or the like and may be, for example, a platinum electrode. In addition, a voltage of 3 V or more may be applied as power for one minute to 24 hours, and thus, the pores H can be smoothly formed up to the first conductive semiconductor layer of the LED wafer corresponding to the lower portion of each of the plurality of device pillars. Accordingly, the plurality of device pillars can be more easily separated from the wafer. More preferably, a voltage of 10 V or more may be applied, and more preferably, a voltage of 30 V or less may be applied. When a voltage of less than 3 V is applied, even when an application time of power is increased, pores may not smoothly formed up to the portion of the first conductive semiconductor layer of the LED wafer corresponding to the lower portion of each of the plurality of device pillars, and thus, it may be difficult to separate the device pillars, or even though the device pillars are separated, separated one cross sections of the device pillars may have different shapes, which may make it difficult for the plurality of device units to exhibit uniform emission characteristics. In addition, when a voltage exceeding 30 V is applied, pores may be formed up to a portion of the first conductive semiconductor layer of the device pillar, thereby causing the deterioration of emission characteristics. In addition, the separation point of the device pillar may be changed, and thus, there is a risk that the device unit having the first conductive semiconductor layer having a thickness thinner than the desired thickness of the first conductive semiconductor layer may be obtained. In addition, similarly to an effect according to a strength of a voltage, when an application time of power is increased, pores are likely to be formed in the portion of the first conductive semiconductor layer other than a desired portion, and on the contrary, when the application time is decreased, pores may not be smoothly formed, and thus, it may be difficult to separate the device pillars.

Thereafter, as illustrated in FIG. 10(*k*), an upper pattern layer 73 and side pattern layers 73' and 73" for forming the first handle electrode 21 may be formed on the LED wafer. In this case, the formation position of the side pattern layer 73" on the side surface where the first handle electrode 21 is formed may be determined in consideration of the shape of the first handle electrode 21. For example, when the side pattern layer 73" is formed to contact the protruded side surface of the first conductive semiconductor layer, the first handle electrode 21 having a cross-sectional shape as illustrated in FIG. 3*a* may be implemented. When the side pattern layer 73" is formed to be spaced apart from the protruded side surface of the first conductive semiconductor layer by a predetermined distance as illustrated in FIG. 10(*k*), the first handle electrode 21 having a cross-sectional shape as illustrated in FIG. 3*b* or FIG. 4 may be implemented.

Next, an electrode material is processed on the LED wafer to form the first handle electrode 21, and then the pattern layer is removed to manufacture the device pillar on which the first handle electrode is formed, as illustrated in FIG. 10(*l*). The material of the first handle electrode 21 described above may be used as the electrode material, and the electrode material may be processed in an appropriate method in consideration of the type of the selected electrode material. For example, the first handle electrode 21 may be formed through deposition.

Next, as a pre-step to more easily and uniformly form the second handle electrode 22 on each device unit separated after separating the plurality of device pillars on which the first handle electrode 21 is formed from the LED wafer, the step of forming an adhesive layer on the LED wafer on which the device pillar is formed so that the position between the device units is maintained in the same state as before separation even after being integrally separated (FIG. 11(*m*)) and the step of attaching a support substrate 83 on the adhesive layer 82 (FIG. 11(*n*)) may be performed.

However, before the adhesive layer 82 is formed, on the upper surface of the first conductive semiconductor layer of the LED wafer corresponding between the plurality of device pillars, a spacing layer 81 may be formed to a thickness thinner than the thickness of the device pillar. In order to separate the plurality of device pillars without damage by using the pores H formed in a portion of the first conductive semiconductor layer of the LED wafer in the previous step, a bubble-forming solution should be in contact with the upper surface of the first conductive semiconductor layer of the LED wafer corresponding between the plurality of device pillars. The spacing layer 81 is removed prior to treatment of the bubble-forming solution to secure a space for the bubble-forming solution to contact the upper surface of the first conductive semiconductor layer. That is, when the adhesive layer 82 for introducing the support substrate 83 is formed on the LED wafer without the spacing layer 81, the bubble-forming solution cannot contact the upper surface of the first conductive semiconductor layer of the LED wafer due to the adhesive layer 82, and this may make it difficult to separate the device pillar.

The spacing layer 81 may be formed of a material capable of maintaining a predetermined layer without being disturbed by the formation of the adhesive layer 82 and of an easily removable material. For example, the spacing layer 81 may be formed with polymethylmethacrylate (PMMA) or a photosensitive polymer for lift-off (LOR).

In addition, an adhesive composition may be treated on the LED wafer on which the plurality of device pillars formed with the spacing layer 81 to a predetermined thickness is formed to form the adhesive layer 82. The adhesive composition may be a known adhesive composition suitable for fixing the support substrate 83 and easy to be removed for separation of the support substrate 83 later, and the adhesive composition may be, for example, an epoxy resin composition. The adhesive layer 82 may be formed to cover the device pillar, and may have a thickness of 10 to 20000 nm based on the upper surface of the device pillar.

Thereafter, the support substrate 83 is disposed on the adhesive layer 82, and then, the support substrate 83 may be fixed by applying pressure. In this case, a predetermined heat or light may be applied together for curing the epoxy composition for bonding, but the present invention is not limited thereto, and the bonding method may be appropriately changed according to the composition of the bonding composition.

Thereafter, as described above, the step of removing the spacing layer 81 may be performed so that the bubble-forming solution for separating the plurality of device pillars can contact the first conductive semiconductor layer in which the pores are formed. The spacing layer 81 may be removed using an appropriate removal solution depending on the material. For example, the spacing layer 81 formed of PMMA or LOR may be removed using a removal solution such as acetone or N-methyl-2 pyrrolidone (NMP).

After that, the step of separating the plurality of device pillars from the LED wafer by treating the bubble-forming solution (or solvent) so that the bubble-forming solution (or solvent) contacts the exposed surface of the first conductive semiconductor layer in which the pores are formed at the position where the spacing layer 81 is removed, and then applying ultrasonic waves to the wafer may be performed (FIG. 11(*o*)).

Ultrasonic waves may be directly applied to the LED wafer with pores without the bubble-forming solution to collapse the pores through a physical external force to separate the device pillars. However, in this method, the collapse of the pores is not smooth, and when the pores are excessively formed to facilitate the collapse, the pores are likely to be formed up to the first conductive semiconductor layer 1 included in the device pillar, which may cause a side effect of reducing the quality of the LED structure.

This step may be performed using a sonochemical method Specifically, after the LED wafer is immersed in a bubble-forming solution (or solvent), ultrasonic waves are applied to the bubble-forming solution (or solvent) to collapse the pores through energy generated when bubbles generated and grown through a sonochemical mechanism burst in the pores, thereby easily separating the plurality of device pillars from the LED wafer. Specifically, ultrasonic waves alternately generate a relatively high pressure portion and a relatively low pressure portion in a traveling direction of a sound wave. In this case, generated bubbles pass through the high pressure portion and the low pressure portion and repeatedly contract and expand to grow into bubbles with a higher temperature and high pressure and then collapse, and when the bubbles collapse, as an example, the bubbles become local hot spots that generate a high temperature of 4,000 K and a high pressure of 1,000 atmospheric pressure. Therefore, by using such energy, the pores generated in the LED wafer may be collapsed to separate the device pillars from the wafer. After all, the ultrasonic wave only performs a function of generating and growing bubbles in the bubble-forming solution (or solvent) and moving and allowing the generated bubbles to penetrate into the pores 11 formed in the first conductive semiconductor layer. Then, through a pore collapse mechanism in which the pores H are collapsed by an external force generated at the time of the bursting of the bubbles in an unstable state with a high temperature and high pressure, which have penetrated into the pores H, the plurality of device pillars may be easily separated from the LED wafer.

A solution (or solvent) capable of generating bubbles when ultrasonic waves are applied and growing to have high pressure and temperature may be used as the bubble-forming solution (or solvent) without limitation, and preferably, the bubble-forming solution (or solvent) may have a vapor pressure of 100 mmHg or less (at 20° C.), for example, a vapor pressure of 80 mmHg or less (at 20° C.), a vapor pressure of 60 mmHg or less (at 20° C.), a vapor pressure of 50 mmHg or less (at 20° C.), a vapor pressure of 40 mmHg or less (at 20° C.), a vapor pressure of 30 mmHg or less (at 20° C.), a vapor pressure of 20 mmHg or less (at 20° C.), or a vapor pressure of 10 mmHg or less (at 20° C.). When a solvent having a vapor pressure exceeding 100 mmHg (at 20° C.) is used, the separation of the device pillar may not occur properly within a short time, and thus there is a risk of a manufacturing time being increased and production costs being increased. The bubble-forming solution (or solvent) satisfying such physical properties may include, for example, at least one selected from the group consisting of gamma-butyllactone, propylene glycol methyl ether acetate, methyl pyrrolidone, and 2-methoxyethanol. Meanwhile, a solution (or solvent) having a vapor pressure of 100 mmHg at room temperature, for example, 20° C., may be used as the bubble-forming solution (or solvent), but alternatively, by adjusting temperature or pressure conditions for performing this step, this step may be performed by adjusting a vapor pressure of the bubble-forming solution (or solvent) so as to be 100 mml-Ig or less under the above conditions (for example, low temperature conditions). In this case, types of usable solvents may be wider, and as an example, solvents such as water, acetone, chloroform, and alcohols may be used.

In addition, a wavelength of an ultrasonic wave applied in this step may be in a range capable of causing a sonochemical effect, and specifically, the ultrasonic wave may be applied at a frequency capable of growing and collapsing bubbles so as to become local hot spots that generate high pressure and temperature when collapsed. As an example, the frequency may be in a range of 20 kHz to 2 MHz, and an application time of the applied ultrasonic wave may be in a range of 1 minute to 24 hours, thereby making it easy to separate the device pillars from the LED wafer Even when a wavelength of an applied ultrasonic wave falls within the range, when an intensity of the applied ultrasonic wave is low or an application time thereof is short, there is a risk that there are the device pillars that are not separated from the LED wafer or that the number of the device pillars that are not separated from the LED wafer is increased. In addition, when the intensity of the applied ultrasonic wave is high or the application time is long, the device pillars may be damaged.

Meanwhile, for a more specific method of the above-described steps of forming pores in the first conductive semiconductor layer as illustrated in FIG. 10(*j*) or removing the device pillars from the LED wafer using the bubble-forming solution (or solvent) as illustrated in FIG. 11(0), the entirety of KR Patent Application No. 10-2020-0189204 by the inventor of the present invention is incorporated herein as a reference.

The plurality of device units in which the first handle electrode 21 is formed is separated from the LED wafer while being integrally fixed to the above-described support substrate 83, and in order to prepare a space for the formation of the second handle electrode 22, a portion of the other end opposite to one end of the device units on which the first handle electrode 21 is formed may be etched in the thickness direction. For this etching, a predetermined pattern layer 74 may be formed to cover the first conductive semiconductor layer 1 and first handle electrode 21 of the device units except the portion of the other end as illustrated in FIG. 11(*p*).

Thereafter, as illustrated in FIG. 11(*q*), the exposed portion of the device unit is etched in the thickness direction along the pattern layer 74 up to just before the second electrode layer 5 to remove the portions of the first semiconductor layer 1, photoactive layer 2, and second conductive semiconductor layer 3 corresponding to the exposed portions of the device unit. In this case, the etching of the device unit may be performed through a dry etching method using ICP. In addition, the pattern layer 74 formed for etching may be removed through a known method.

In order to electrically disconnect the second handle electrode 22 to be formed later and the first conductive semiconductor layer 1 and the photoactive layer 2, as illustrated in FIG. 11(*r*), the second insulating film 32 may be formed on the plurality of device units. Since the second insulating film 32 is the same as that of the first insulating film 31 described with reference to FIG. 10(*h*), a detailed description thereof will be omitted.

Thereafter, as illustrated in FIG. 11(*s*), a pattern layer 75 may be formed to maintain a portion of the second insulating film 32 formed to cover the side surfaces of the first conductive semiconductor layer 1 and photoactive layer 2 while exposing a portion of the second electrode layer 5 to which the second handle electrode 22 electrically contact. In this case, the pattern layer 75 may be formed only up to a portion corresponding to the protruded end of the second electrode layer 5 at the maximum. When the pattern layer 75 is formed to exceed the portion corresponding to the protruded end, there is a risk that the protruded end surface of the second electrode layer 5 may not be exposed even when the second insulating layer 32 is etched. Preferably, the pattern layer 75 may be formed so thin that it does not reach the protruded end of the second electrode layer 5, and through this, in addition to the protruded end of the second electrode layer 5, the upper surface of the protruded portion of the second electrode layer 5 may be exposed, so it may be advantageous to increase the contact area with the second handle electrode 22.

Thereafter, as illustrated in FIG. 11(*t*), a portion of the second insulating film 32 may be removed to expose the protruded end surface of the second electrode layer 5, the upper surfaces of the first conductive semiconductor layer 1 and first handle electrode 21. In this case, for example, when the second insulating film 32 is $SiO_2$, it may be removed through a dry etching method through RIE. Also, after etching the second insulating film 32, the pattern layer 75 may be removed using a solvent such as acetone.

Thereafter, as illustrated in FIG. 11(*u*), an upper pattern layer 76 and a side pattern layer 76' may be formed on the adhesive layer 82 before forming the second handle electrode 22. In this case, the side pattern layer 76' is spaced apart from the protruded end surface of the second electrode layer 5 by a predetermined distance so that the second handle electrode 22 can be formed in contact with the end surface of the second electrode layer 5.

After that, the second handle electrode 22 is formed by treating an electrode material above the adhesive layer 82, and then the pattern layers 76, 76' are removed to manufacture the ultra-thin fin LED device in which the second handle electrode 22 is formed as illustrated in FIG. 11(*v*). In this case, the above-described material of the second handle electrode 22 may be used as the electrode material. For example, the second handle electrode 22 may be formed through deposition.

Next, in order to separate the plurality of ultra-thin fin LED devices 105 from the support substrate 83, a process of removing the adhesive layer 82 may be performed. For example, when the adhesive layer 82 is an epoxy layer, the adhesive layer 82 is removed using an NMP-based solvent and the ultra-thin fin LED devices are separated from the support substrate 83 (FIG. 11(*w*)), so that a single ultra-thin fin LED device can be finally obtained (FIG. 11(*x*)).

The ultra-thin fin LED devices 100, 101, 102, 103, 104, 105 according to the present invention described above may be suitable for use in an electric field array assembly in which the LED devices are self-aligned on an electrode through an electric field induction arrangement. The electric field arrangement assembly is an assembly implemented by an electric field arrangement method in which a device is placed on an electrode using an electric field formed by applying a voltage to the electrode, and for the detailed description thereof, the contents of KR Patent Registered Publication Nos. 10-1490758 and 10-1436123 are incorporated herein by reference.

Figure 9:
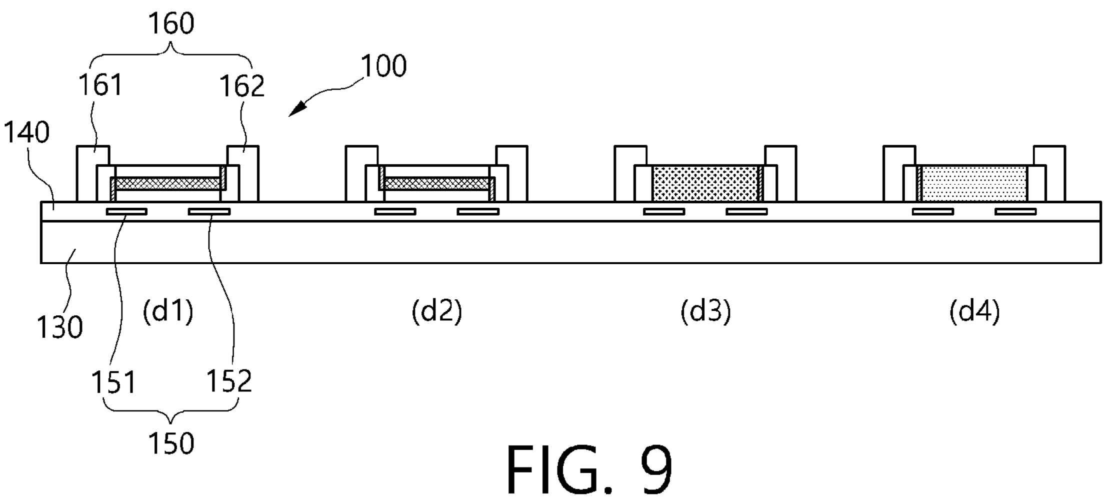

FIGS. 8 and 9 illustrate an ultra-thin fin LED electrode assembly implemented using the ultra-thin fin LED device 100 according to the present invention.

In an ultra-thin fin LED electrode assembly illustrated in FIG. 8, the LED device 100 is mounted on the first mounting electrode 111 and second mounting electrode 112 extending in a first direction and spaced apart in a second direction different from the first direction on the substrate 130 so that the electrodes provided at both ends of the ultra-thin fin LED element 100 in the longitudinal direction are in contact with the first and second mounting electrodes 111, 112 through an electric field arrangement. In this case, the ultra-thin fin LED device 100 may be mounted so that the alignment surface of the mounted ultra-thin fin LED device 100 in contact with the first mounting electrode 111 and the second mounting electrode 112 is any one of an upper surface C1, a lower surface C2, and any one side surface of both side surfaces C3 and C4. Even if any alignment surface is in contact with the first mounting electrode 111 and the second mounting electrode 112, the first mounting electrode 111 and the second mounting electrode 112 can emit light when the driving power is applied. Therefore, it is possible to realize an ultra-thin fin electrode assembly that can emit light with high efficiency without wasting manufacturing cost because all the LED devices can emit light as much as the number of input LED devices.

The ultra-thin fin LED electrode assembly illustrated in FIG. 9 is implemented differently from the ultra-thin fin LED electrode assembly illustrated in FIG. 8 such that an alignment electrode line 150 having a first alignment electrode 151 and a second alignment electrode 152 is formed on a substrate 130, an insulating layer 140 is formed on the alignment electrode line 150 so that the alignment electrode line 150 and the ultra-thin fin LED device 100 do not contact each other, and the ultra-thin fin LED device 100 is arranged so that one end in the longitudinal direction is positioned on the insulating layer 140 corresponding to the upper portion of the first alignment electrode 151, and the other end in the longitudinal end is positioned on the insulating film 140 corresponding to the upper portion of the second alignment electrode 152, a first driving electrode 161 is formed to be electrically connected to the first handle electrode at one end in the longitudinal direction of the aligned plurality of ultra-thin fin LED devices 100, and the second driving electrode 162 is formed to be electrically connected to the second handle electrode at the other end in the longitudinal direction.

In the ultra-thin fin LED electrode assembly having such a structure, the driving electrode line 160 for driving the ultra-thin fin LED device 100 is separately provided, so that even if the alignment electrode line 150 is damaged in the process of aligning the ultra-thin fin LED device 100, there is no problem in driving the ultra-thin fin LED device 100. Thus, it is possible to further expand the selection of the intensity of the voltage applied to the alignment electrode line 150, and there is an advantage in that it is possible to prevent damage to the electrode due to the power applied during alignment and the concern that some ultra-thin fin LED devices may not emit light by using the damaged electrode as the driving electrode. The detailed description of the ultra-thin fin LED electrode assembly having the structure as illustrated in FIG. 9 will be omitted below because the entirety of KR Patent Registration No. 10-2053217 by the present inventor is inserted herein as a reference.

In addition, the present invention includes a light source provided with the above-described ultra-thin fin LED device or ultra-thin fin LED electrode assembly. The light source may include, for example, various LED lights for home/vehicle, a light emitting source of various displays such as a backlight unit employed in LCD or a light emitting source of an active display, medical devices, beauty devices, various optical devices, or one component constituting the same.

The ultra-thin fin LED device according to the present invention is advantageous in achieving high luminance and light efficiency by increasing an emission area compared to the conventional rod-type LED device. In addition, while increasing the emission area, the area of the photoactive layer exposed to the surface is greatly reduced, thereby preventing or minimizing the degradation in efficiency due to surface defects. Furthermore, it is possible to minimize a degradation in electron-hole recombination efficiency due to non-uniformity of electron and hole velocities and a resulting degradation in luminous efficiency. In addition, it is very suitable for the method of self-aligning devices on the electrode by an electric field, and since it is not limited by the alignment surface in contact with the electrode during self-alignment, it can be driven regardless of the alignment surface, so it is widely applied as a material for displays and various light sources.

While the embodiments of the present invention have been described above, the spirit of the present invention is not limited to the embodiment presented herein. One skilled in the art may easily suggest other embodiments due to addition, modification, deletion, inclusion, and the like of components within the same spirit of the present invention, and the addition, modification, deletion, inclusion, and the like of the components fall within the scope and spirit of the present invention.

What is claimed is:

1. An ultra-thin fin LED device, comprising:

a device unit that has a length, a width and a thickness in mutually perpendicular x, y, and z-axis directions, respectively, the length being longer than the width and the thickness, and includes a first conductive semiconductor layer, a photoactive layer, and a second conductive semiconductor layer that are sequentially stacked in the z-axis direction; and an electrode unit that includes a first handle electrode formed to at least partially cover a side surface that is a first end surface of the device unit in the x-axis direction and a second handle electrode formed to at least partially cover a side surface that is a second end surface opposite to the first end surface, wherein the first handle electrode is electrically connected only to the first conductive semiconductor layer among the first conductive semiconductor layer, the photoactive layer, and the second conductive semiconductor layer, and the second handle electrode is electrically connected only to the second conductive semiconductor layer among the first conductive semiconductor layer, the photoactive layer, and the second conductive semiconductor layer.

2. The ultra-thin fin LED device according to claim 1, further comprising an insulating unit, wherein the insulating unit includes:

a first insulating film that is interposed between the first handle electrode and a portion corresponding to the photoactive layer and the second conductive semiconductor layer on the first end surface of the device unit in the x-axis direction so that the first handle electrode is electrically connected only to the first conductive semiconductor layer; and a second insulating film that is interposed between the second handle electrode and a portion corresponding to the photoactive layer and the first conductive semiconductor layer on the second end surface of the device unit in the x-axis direction so that the second handle electrode is electrically connected only to the second conductive semiconductor layer.

3. The ultra-thin fin LED device according to claim 1, further comprising a second electrode layer provided to cover an upper surface of the second conductive semiconductor layer, wherein the second electrode layer is indirectly electrically connected to the second handle electrode via the second conductive semiconductor layer or directly electrically connected to the second handle electrode.

4. The ultra-thin fin LED device according to claim 1, wherein the device unit includes a step formed by protruding any layer constituting the device unit in order to increase a contact area between any one or both end surfaces of the first end surface and the second end surface of the device unit in the x-axis direction and any one or two of the handle electrodes.

5. The ultra-thin fin LED device according to claim 1, wherein the first handle electrode is provided to completely cover the first end surface of the device unit and the second handle electrode is provided to completely cover the second end surface of the device unit, so as to reduce a contact resistance with an electrode on which the ultra-thin fin LED device is mounted.

6. The ultra-thin fin LED device according to claim 2, wherein a thickness of the first insulating film and second insulating film, which is the length in the x-axis direction, is 5 to 100 nm.

7. The ultra-thin fin LED device according to claim 1, wherein the ultra-thin fin LED device has the length of 1 to 10 μm, and the thickness of 0.1 to 3 μm.

8. The ultra-thin fin LED device according to claim 1, wherein a ratio of the length and thickness of the ultra-thin fin LED device is 3:1 or more.

9. The ultra-thin fin LED device according to claim 1, wherein an emission area of the ultra-thin fin LED device exceeds twice an area of a vertical cross-section of the device unit.

10. The ultra-thin fin LED device according to claim 1, wherein the ultra-thin fin LED device is used for an electric field array assembly in which the LED device is mounted on different electrodes through self-alignment by electric field induction arrangement.

11. The ultra-thin fin LED device according to claim 1, wherein one of the first conductive semiconductor layer and the second conductive semiconductor layer includes a p-type GaN semiconductor layer, and the other includes an n-type GaN semiconductor layer, the p-type GaN semiconductor layer has a thickness of 10 to 350 nm, and the n-type GaN semiconductor layer has a thickness of 1000 to 3000 nm, and a thickness of the photoactive layer has a thickness of 30 to 200 nm.

12. An ultra-thin fin LED electrode assembly, comprising:

a mounting electrode line that extends in a first direction and includes first and second mounting electrodes spaced apart from each other in a second direction different from the first direction; and a plurality of the ultra-thin fin LED devices, wherein each ultra-thin fin LED device of the plurality of ultra-thin fin LED devices comprises;

a device unit that has a length, a width and a thickness in mutually perpendicular x, y, and z-axis directions, respectively, the length being longer than the width and the thickness, and includes a first conductive semiconductor layer, a photoactive layer, and a second conductive semiconductor layer that are sequentially stacked in the z-axis direction; and an electrode unit that includes a first handle electrode formed to at least partially cover a side surface that is a first end surface of the device unit in the x-axis direction and a second handle electrode formed to at least partially cover a side surface that is a second end surface opposite to the first end surface, wherein the first handle electrode is electrically connected only to the first conductive semiconductor layer among the first conductive semiconductor layer, the photoactive layer, and the second conductive semiconductor layer, and the second handle electrode is electrically connected only to the second conductive semiconductor layer among the first conductive semiconductor layer, the photoactive layer, and the second conductive semiconductor layer, wherein the first handle electrode at one end in a longitudinal direction is electrically connected to the first mounting electrode, and the second handle electrode at the other end in the longitudinal direction is electrically connected to the second mounting electrode.

13. An ultra-thin fin LED electrode assembly, comprising:

an alignment electrode line that includes a first alignment electrode and a second alignment electrode extends in a first direction and spaced apart from each other in a second direction different from the first direction;

an insulating layer that is formed to cover an upper portion of the alignment electrode line;

a plurality of the ultra-thin fin LED devices, wherein each ultra-thin fin LED device of the plurality of ultra-thin fin LED devices comprises;

a device unit that has a length, a width and a thickness in mutually perpendicular x, y, and z-axis directions, respectively, the length being longer than the width and the thickness, and includes a first conductive semiconductor layer, a photoactive layer, and a second conductive semiconductor layer that are sequentially stacked in the z-axis direction; and an electrode unit that includes a first handle electrode formed to at least partially cover a side surface that is a first end surface of the device unit in the x-axis direction and a second handle electrode formed to at least partially cover a side surface that is a second end surface opposite to the first end surface, wherein the first handle electrode is electrically connected only to the first conductive semiconductor layer among the first conductive semiconductor layer, the photoactive layer, and the second conductive semiconductor layer, and the second handle electrode is electrically connected only to the second conductive semiconductor layer among the first conductive semiconductor layer, the photoactive layer, and the second conductive semiconductor layer wherein the first handle electrode at one end in a longitudinal direction is positioned on the insulating layer corresponding to an upper portion of the first alignment electrode, and the second handle electrode at the other end in the longitudinal direction is positioned on the insulating layer corresponding to an upper portion of the second alignment electrode; and a driving electrode line that includes a first driving electrode formed to be electrically connected to the first handle electrode and a second driving electrode formed to be electrically connected to the second handle electrode.

* * * * *